(12) United States Patent
Seo et al.

(10) Patent No.: US 9,859,346 B2
(45) Date of Patent: Jan. 2, 2018

(54) ORGANIC LIGHT-EMITTING DIODE DISPLAY AND METHOD OF MANUFACTURING THE SAME

(71) Applicant: Samsung Display Co., Ltd., Yongin-si, Gyeonggi-do (KR)

(72) Inventors: Taean Seo, Yongin-si (KR); Kihyun Kim, Yongin-si (KR); Juchan Park, Yongin-si (KR); Younggug Seol, Yongin-si (KR); Pilsuk Lee, Yongin-si (KR); Jinhwan Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/255,632

(22) Filed: Sep. 2, 2016

(65) Prior Publication Data

US 2017/0077195 A1    Mar. 16, 2017

(30) Foreign Application Priority Data

Sep. 15, 2015 (KR) .................. 10-2015-0130596

(51) Int. Cl.
*H01L 27/32* (2006.01)
*H01L 51/52* (2006.01)

(52) U.S. Cl.
CPC ...... *H01L 27/3246* (2013.01); *H01L 51/5253* (2013.01); *H01L 51/5256* (2013.01); *H01L 2251/5338* (2013.01)

(58) Field of Classification Search
CPC ......... H01L 27/32; H01L 51/52; H01L 51/56; H01L 27/3246; H01L 51/5253
See application file for complete search history.

(56) References Cited

U.S. PATENT DOCUMENTS

| 2011/0140113 | A1 | 6/2011 | Park |
| 2012/0268000 | A1 | 10/2012 | Choi et al. |
| 2013/0248867 | A1* | 9/2013 | Kim ................... H01L 51/5253 257/59 |
| 2013/0300697 | A1 | 11/2013 | Kim et al. |

(Continued)

FOREIGN PATENT DOCUMENTS

| KR | 10-2002-0022287 A | 3/2002 |
| KR | 10-2011-0067404 A | 6/2011 |
| KR | 10-2012-0119097 A | 10/2012 |

(Continued)

*Primary Examiner* — Roy Potter
*Assistant Examiner* — Paul Patton
(74) *Attorney, Agent, or Firm* — Knobbe, Martens, Olson & Bear, LLP

(57) ABSTRACT

An organic light-emitting diode (OLED) display and a method of manufacturing the same are disclosed. In one aspect, the OLED display includes an OLED formed over a substrate, the OLED including a first electrode, a second electrode formed over the first electrode and an intermediate layer interposed between the first and second electrodes. A pixel defining layer is formed over the substrate and adjacent to the OLED, and a protection layer is formed over the second electrode and configured to protect the OLED. A thin-film encapsulating layer is formed over the protection layer and sealing the OLED so as to protect the OLED from the environment, at least a part of the thin-film encapsulating layer contacting the pixel defining layer.

18 Claims, 8 Drawing Sheets

(56) References Cited

U.S. PATENT DOCUMENTS

2014/0217373 A1    8/2014   Youn et al.
2014/0232956 A1    8/2014   Kwon et al.

FOREIGN PATENT DOCUMENTS

| KR | 10-2013-0127050 A | 11/2013 |
| KR | 10-2014-0039470 A | 4/2014 |
| KR | 10-2014-0064156 A | 5/2014 |
| KR | 10-2014-0099164 A | 8/2014 |
| KR | 10-2014-0103025 A | 8/2014 |
| KR | 10-2014-0129647 A | 11/2014 |
| KR | 10-2014-0148176 A | 12/2014 |

\* cited by examiner (a)

(b)

(c)

ORGANIC LIGHT-EMITTING DIODE DISPLAY AND METHOD OF MANUFACTURING THE SAME

CROSS-REFERENCE TO RELATED APPLICATION

This application claims the benefit of Korean Patent Application No. 10-2015-0130596, filed on Sep. 15, 2015, in the Korean Intellectual Property Office, the disclosure of which is incorporated herein in its entirety by reference.

BACKGROUND

Field

The described technology generally relates to an organic light-emitting diode (OLED) display and a method of manufacturing the same.

Description of the Related Technology

An OLED display includes an OLED having a hole-injecting electrode, an electron-injecting electrode, and an interposed organic light-emitting layer. The OLED emits light as excitons, generated by the combination of holes injected by the hole-injecting electrode and electrons injected by the electron-injecting electrode at the organic light-emitting layer, are transitioned from excited state to ground state.

Since OLED technology requires no separate light source, there are desirable characteristics such as being driven with a low voltage, being lightweight and thin, and having a wide viewing angle, high contrast, and rapid response rate. Therefore, an OLED display is being spotlighted as a next-generation display apparatus.

SUMMARY OF CERTAIN INVENTIVE ASPECTS

One inventive aspect relates to an OLED display and a method of manufacturing the same.

Another aspect is an OLED display that includes a substrate; an OLED, which is formed on the substrate and includes a first electrode, an intermediate layer, and a second electrode; a pixel defining layer, which is formed on the substrate and defines a pixel region including the OLED and emitting light and a non-pixel region; a protection layer, which is formed on the second electrode and protects the OLED; and a thin-film encapsulating layer, which is formed on the protection layer and seals the OLED to protect the OLED from outside, wherein the thin-film encapsulating layer is formed to contact the pixel defining layer at at least a region.

The first electrode may be formed between the pixel defining layers adjacent to each other, the intermediate layer may be formed on the first electrode, and the second electrode and the protection layer may be formed on the intermediate layer and the pixel defining layer.

The protection layer may be formed of a LiF-containing material.

The second electrode and the protection layer may be pattern-formed, such that a first opening is formed at at least portions thereof contacting the pixel defining layer.

The thin-film encapsulating layer may be formed to directly contact the pixel defining layer at the first opening.

The thin-film encapsulating layer may be formed by alternately stacking a plurality of inorganic layers and organic layers.

The thin-film encapsulating layer may include an inorganic layer; and an organic layer, which is formed on the inorganic layer, wherein the inorganic layer contacts the pixel defining layer at the first opening.

A thin-film transistor including an active layer, a gate electrode, a source electrode, and a drain electrode may be formed on the substrate, and the OLED display may further include a gate insulation layer, which is formed between the active layer and the gate electrode; an interlayer insulation layer, which is formed between the gate electrode and the source and drain electrodes; and a via layer, which is formed on the source electrode and the drain electrode.

The substrate may include a bending portion at which a bending occurs, and the interlayer insulation layer and the via layer may be pattern-formed, such that a second opening is formed at the bending portion.

The thin-film encapsulating layer may contact the gate insulation layer at the second opening.

The thin-film encapsulating layer may contact side surfaces of the interlayer insulation layer and the via layer at the second opening.

The thin-film encapsulating layer may include an inorganic layer and an organic layer formed on the inorganic layer, and the inorganic layer may contact the gate insulation layer at the second opening.

Another aspect is a method of manufacturing an OLED display, the method including providing a substrate; forming a thin-film transistor and a via layer on the substrate; forming a pixel defining layer, which defines a pixel region and a non-pixel region, on the via layer; forming an OLED on the via layer; forming a protection layer on the OLED to cover the pixel defining layer; and forming a thin-film encapsulating layer that seals the OLED from the top of the protection layer to protect the OLED from outside, wherein the forming of the OLED includes forming a first electrode between the pixel defining layers adjacent to each other; forming an intermediate layer on the first electrode; and forming a second electrode on the intermediate layer and the first electrode, and, in the forming of the second electrode and in the forming of the protection layer, the second electrode and the protection layer are pattern-formed, such that at least portions thereof contacting the pixel defining layer are removed and a first opening is formed thereat.

The protection layer may be formed of a LiF-containing material.

In the forming of the thin-film encapsulating layer, the thin-film encapsulating layer may be formed to contact the pixel defining layer at the first opening.

The forming of the thin-film encapsulating layer may include forming an inorganic layer on the protection layer; and forming an organic layer on the inorganic layer, and the inorganic layer is formed to contact the pixel defining layer at the first opening.

The substrate may includes a bending portion at which a bending occurs, and the method may further include, after the providing of the substrate, forming a gate insulation layer on the substrate, forming an interlayer insulation layer on the gate insulation layer; and forming a via layer on the interlayer insulation layer.

In the forming of the interlayer insulation layer and in the forming of the via layer, the interlayer insulation layer and the via layer may be pattern-formed to be partially removed at the bending portion, such that a second opening is formed at the second electrode and the protection layer.

In the forming of the thin-film encapsulating layer, the thin-film encapsulating layer may be formed to contact the gate insulation layer at the second opening.

In the forming of the thin-film encapsulating layer, the thin-film encapsulating layer may be formed to contact side surfaces of the interlayer insulation layer and the via layer at the second opening.

Another aspect is an organic light-emitting diode (OLED) display comprising: a substrate; an OLED formed over the substrate and comprising a first electrode, a second electrode formed over the first electrode and an intermediate layer interposed between the first and second electrodes; a pixel defining layer formed over the substrate and adjacent to the OLED; a protection layer formed over the second electrode and configured to protect the OLED; and a thin-film encapsulating layer formed over the protection layer and sealing the OLED so as to protect the OLED from the environment, wherein at least a part of the thin-film encapsulating layer contacts the pixel defining layer.

In the above OLED display, the first electrode is formed between adjacent pixel defining layers, wherein the intermediate layer is formed over the first electrode, wherein the second electrode and the protection layer are formed over the intermediate layer and the pixel defining layer.

In the above OLED display, the protection layer is formed of LiF.

In the above OLED display, the second electrode and the protection layer have a first opening formed over the pixel defining layer, the first opening overlaps at least a part of the thin-film encapsulating layer contacts the pixel defining layer.

In the above OLED display, the thin-film encapsulating layer directly contacts the pixel defining layer at the first opening.

In the above OLED display, the thin-film encapsulating layer comprises: an inorganic layer; and an organic layer formed over the inorganic layer, wherein the inorganic layer contacts the pixel defining layer at the first opening.

In the above OLED display, the thin-film encapsulating layer comprises a plurality of inorganic layers and a plurality of organic layers that are alternately stacked.

The above OLED display further comprises: a thin-film transistor (TFT) including an active layer, a gate electrode, a source electrode, and a drain electrode is formed over the substrate; a gate insulation layer formed between the active layer and the gate electrode; an interlayer insulation layer formed between the gate electrode and the source and drain electrodes; and a via layer formed over the source and drain electrodes.

In the above OLED display, the substrate comprises a bending portion configured to bend, wherein the interlayer insulation layer and the via layer have a second opening formed over the bending portion.

In the above OLED display, the thin-film encapsulating layer contacts the gate insulation layer at the second opening.

In the above OLED display, the thin-film encapsulating layer contacts side surfaces of the interlayer insulation layer and the via layer at the second opening.

In the above OLED display, the thin-film encapsulating layer comprises an inorganic layer and an organic layer formed over the inorganic layer, wherein the inorganic layer contacts the gate insulation layer at the second opening.

Another aspect is a method of manufacturing an organic light-emitting diode (OLED) display, the method comprising: providing a substrate; forming a thin-film transistor (TFT) and a via layer over the substrate; forming a pixel defining layer over the via layer; forming an OLED over the via layer; forming a protection layer over the OLED so as to cover the pixel defining layer; and forming a thin-film encapsulating layer that seals the OLED and the protection layer to protect the OLED from the environment. The forming of the OLED comprises: forming a first electrode between adjacent pixel defining layers; forming an intermediate layer over the first electrode; and forming a second electrode over the intermediate layer and the first electrode, and wherein the second electrode and the protection layer are pattern-formed such that at least portions thereof contacting the pixel defining layer are removed and a first opening is formed therein.

In the above method, the protection layer is formed of LiF.

In the above method, the thin-film encapsulating layer contacts the pixel defining layer at the first opening.

In the above method, the forming of the thin-film encapsulating layer comprises: forming an inorganic layer over the protection layer; and forming an organic layer over the inorganic layer, wherein the inorganic layer contacts the pixel defining layer at the first opening.

In the above method, the substrate comprises a bending portion configured to bend, wherein the method further comprises: after the providing of the substrate, forming a gate insulation layer over the substrate; forming an interlayer insulation layer over the gate insulation layer; and forming a via layer over the interlayer insulation layer.

In the above method, the interlayer insulation layer and the via layer are pattern-formed to be partially removed at the bending portion such that a second opening is formed in the second electrode and the protection layer.

In the above method, the thin-film encapsulating layer contacts the gate insulation layer at the second opening.

In the above method, the thin-film encapsulating layer contacts side surfaces of the interlayer insulation layer and the via layer at the second opening.

Another aspect is an organic light-emitting diode (OLED) display comprising: a substrate; a plurality of OLEDs formed over the substrate; a pixel defining layer interposed between the OLEDs; a thin-film encapsulating layer formed over the pixel defining layer and sealing the OLED so as to protect the OLEDs from the environment, wherein the thin-film encapsulating layer contacts the pixel defining layer through a plurality of openings.

In the above OLED display, the thin-film encapsulating layer includes a first portion formed over the openings and a second portion formed over the OLEDs, wherein the first portion is thicker than the second portion.

DETAILED DESCRIPTION OF CERTAIN INVENTIVE EMBODIMENTS

Figure 1:
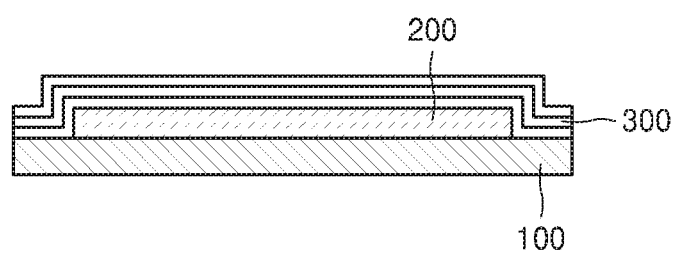
FIG. 1 is a schematic sectional view of an OLED display according to an exemplary embodiment.
Figure 1:
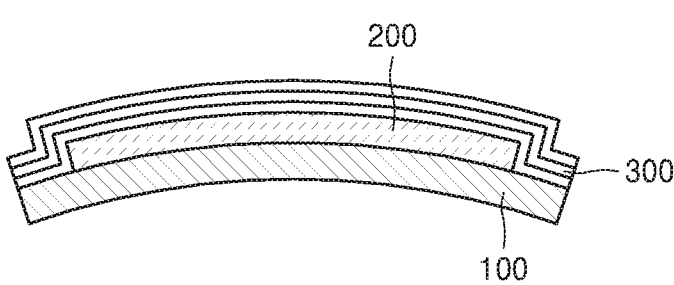
Figure 1:
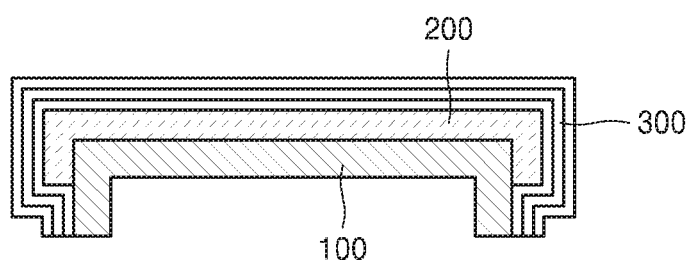

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of the related art are omitted when it is deemed that they may unnecessarily obscure the essence of the present disclosure.

While such terms as "first," "second," etc., may be used to describe various components, such components must not be limited to the above terms. The above terms are used only to distinguish one component from another.

The terms used in the present specification are merely used to describe particular embodiments, and are not intended to limit the present disclosure. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, the present disclosure will be described in detail by explaining preferred embodiments of the present disclosure with reference to the attached drawings. Like reference numerals in the drawings denote like elements. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

FIG. 1 is a schematic sectional view of an OLED display according to an exemplary embodiment.

An OLED display according to the present embodiment includes a substrate 100, a display 200 formed on the substrate 100, and a thin-film encapsulating layer 300 that seals the display 200.

The substrate 100 may be formed of various materials. For example, the substrate 100 may be formed of a glass or one of various insulation materials or may be formed of a metal thin-film.

According to a selective embodiment, the substrate 100 is formed of a flexible material. For example, the substrate 100 is formed of an organic material.

According to a selective embodiment, the substrate 100 is formed of at least one of a silicone-based polymer, polyurethane, polyurethane acrylate, an acrylate polymer, and an acrylate terpolymer. Here, the silicon-based polymer may include polydimethylsiloxane (PDMS) and hexamethyldisiloxane (HMDSO), for example.

The OLED display according to the present embodiment may include the flexible substrate 100, and thus the OLED display may be 2-dimensionally elongated.

According to a selective embodiment, the substrate 100 is formed of a material having a Poisson's ratio of about 0.4 or higher. The Poisson's ratio is the ratio of transverse contraction strain to longitudinal extension strain in the direction of stretching force. By forming the substrate 100 using a material having a Poisson's ratio about 0.4 or higher (that is, by forming the substrate 100 to be highly stretchable), flexibility of the substrate 100 may be improved and the substrate 100 may have a bending portion. Therefore, a display apparatus may easily include a bending portion.

In the OLED display according to the present embodiment, the substrate 100 is formed to be flexible as described above. Therefore, the OLED display according to the present embodiment may be a flat display apparatus or a flexible display apparatus as shown in FIGS. 1A to 1C.

However, flexibility of an OLED display according to an exemplary embodiment is not limited thereto. An OLED display may be entirely bent as shown in FIG. 1B or two opposite ends of an OLED display may be folded as shown in FIG. 1C.

The display 200 is formed on the substrate 100. The display 200 generates visible rays to be visually recognized by a user. The display 200 may include various devices, e.g., an OLED or a liquid crystal display (LCD) device.

In an OLED display according to an exemplary embodiment, the display 200 may include an OLED. Detailed descriptions of the OLED will be given below.

A thin-film encapsulating layer 300 may be formed on the display 200 for completely sealing the display 200 to protect the display 200 from outside moisture or oxygen.

Since the display 200 is protected by the thin-film encapsulating layer 300 in which a plurality of thin-films are stacked, flexibility of an OLED display may be easily secured as shown in FIGS. 1A to 1C.

According to a selective embodiment, the thin-film encapsulating layer 300 may be formed on the display 200, where two opposite ends of the thin-film encapsulating layer 300 may closely contact the substrate 100. Structure and function of the thin-film encapsulating layer 300 will be described below with reference to FIG. 2.

Figure 2:
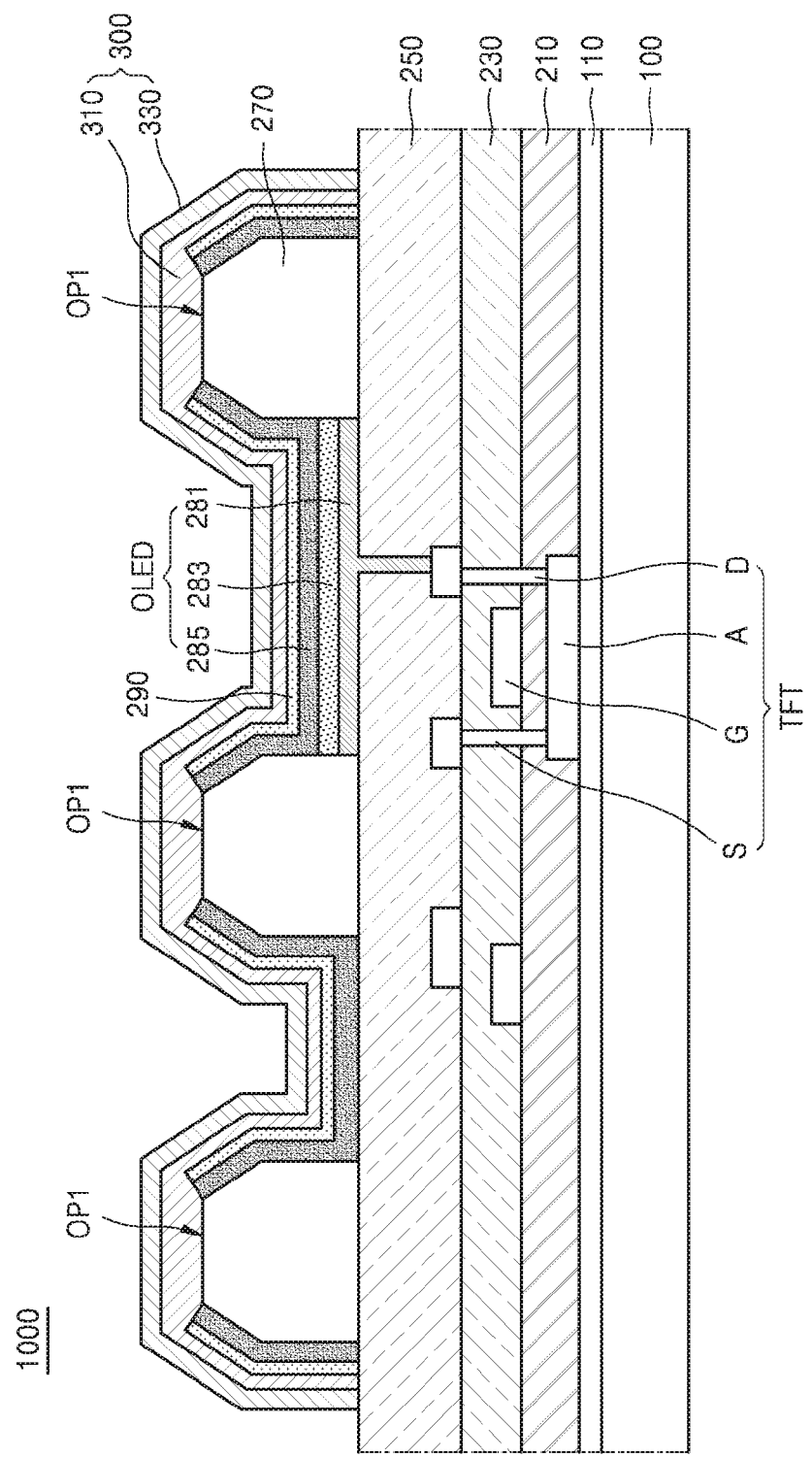
FIG. 2 is a detailed sectional view diagram showing the OLED display of FIG. 1.

FIG. 2 is a sectional view diagram showing the OLED display 1000 according to an exemplary embodiment in closer detail than FIG. 1.

As shown in FIG. 2, in the OLED display 1000, a buffer layer 110 may be formed on the substrate 100. The buffer layer 110 may prevent spreading of impurity ions, prevent permeation of moisture or outside atmosphere, and function as a barrier layer for planarizing a surface and/or a blocking layer.

A thin-film transistor TFT may be formed on the buffer layer 110. An active layer A of the thin-film transistor TFT may be formed of polysilicon and may include a channel that is not doped with an impurity and source and drain regions, which are formed next to two opposite ends of the channel layer and are doped with impurities. Here, types of impurities may vary according to type of the thin-film transistor TFT, where an N-type impurity or a P-type impurity may be employed.

After the active layer A is formed, a gate insulation layer 210 may be formed on the active layer A.

The gate insulation layer 210 may include a single layer or multiple layers formed of an inorganic material, e.g., a silicon oxide or a silicon nitride. The gate insulation layer 210 insulates the active layer A from a gate electrode G on the active layer A.

After the gate insulation layer 210 is formed, the gate electrode G may be formed on the gate insulation layer 210. The gate electrode G may be formed via a photolithography operation and an etching operation.

Materials constituting the gate electrode G may be formed of at least one or more metals of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

After the gate electrode G is formed, an interlayer insulation layer 230 may be formed throughout a surface of the substrate 100.

The interlayer insulation layer 230 may be formed of an inorganic material. For example, the interlayer insulation layer 230 is formed of a metal oxide or a metal nitride. For example, the inorganic material may be formed of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zirconium oxide ($ZrO_2$).

The interlayer insulation layer 230 may include a single layer or multiple layers formed of an inorganic material, such as a silicon oxide ($SiO_x$) and/or a silicon nitride ($SiN_x$). According to some embodiments, the interlayer insulation layer 230 may have a double layer structure including $SiO_x/SiN_y$, or $SiN_x/SiO_y$.

A source electrode S and a drain electrode D of the thin-film transistor TFT may be arranged on the interlayer insulation layer 230.

The source electrode S and the drain electrode D may be formed of one or more metals of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A via layer 250 is formed throughout a surface of the substrate 100 to cover the source electrode S and the drain electrode D. The via layer 250 may protect the thin-film transistor TFT.

An OLED may be arranged on the via layer 250. According to the embodiment shown in FIG. 2, the OLED is connected to the drain electrode D via a via hole.

The OLED may include a first electrode 281, an intermediate layer 283 including an organic light-emitting layer, and a second electrode 285.

Holes and electrons injected by the first electrode 281 and the second electrode 285 of the OLED are combined with each other at the organic light-emitting layer of the intermediate layer 283, thereby emitting light.

The first electrode 281 and the second electrode 285 may be formed of various conductive materials.

According to a selective embodiment, the first electrode 281 and/or the second electrode 285 is formed of a phototransmissive material or a reflective material.

In case of a top emission structure for embodying an image toward the second electrode 285, the first electrode 281 may be arranged as a reflective electrode. To this end, the first electrode 281 includes a reflective film formed of an alloy containing Al or Ag.

In case of using the first electrode 281 as an anode, the first electrode 281 is formed to include a layer formed of a metal oxide with a high work function (absolute value), such as ITO, IZO, and ZnO. In case of using the first electrode 281 as a cathode, a highly conductive metal with a low work function (absolute value), such as Ag, Mg, Al, Pt, Pd, Au, Ni, Nd, Ir, Cr, Li, or Ca, is used to form the first electrode 281. Therefore, in this case, the above-stated reflective layer is not necessary.

The second electrode 285 may be arranged as a phototransmissive electrode. To this end, the second electrode 285 may include a semi-transmissive reflective layer, which is a thin-film formed of Ag, Mg, Al, Pt, Pd, Au, Ni, Nd, Ir, Cr, Li, or Ca, or a phototransmissive metal oxide, such as ITO, IZO, or ZnO.

In case of using the first electrode 281 as an anode, the second electrode 285 is used as a cathode. In case of using the first electrode 281 as a cathode, the second electrode 285 is used as an anode.

The intermediate layer 283 may be formed between the first electrode 281 and the second electrode 285 and may include an organic light-emitting layer.

According to a selective embodiment, the intermediate layer 283 may include an organic light-emitting layer and may further include at least one of common layers including a hole injection layer (HIL), a hole transport layer (HTL), a hole blocking layer (Buffer), an electron transport layer (ETL), and an electron injection layer (EIL). However, the present embodiment is not limited thereto. For example, the intermediate layer 283 may include a light-emitting layer and may further include common layers that perform various other functions.

According to a selective embodiment, common layers including a hole injection layer (HIL) and a hole transport layer (HTL) are formed on the first electrode 281, and an light-emitting layer is formed on the hole transport layer (HTL).

According to a selective embodiment, a common layer, which is a hole blocking layer (Buffer), may be formed on the light-emitting layer, and common layers including an electron transport layer (ETL) and an electron injection layer (EIL) may be formed on the hole blocking layer (Buffer).

The hole injection layer (HIL) may be formed of a phthalocyanine compound, such as copper phthalocyanine, or a starburst amines of type TCTA, such as m-MTDATA or m-MTDAPB.

The hole transport layer (HTL) may be formed of N,N'-bis (3-methylphenyl)-N, N'-diphenyl-[1,1-biphenyl]-4,4'-diamine (TPD) or N,N'-di (naphthalene-1-yl)-N,N'-diphenyl benzidine (α-NPD).

The electron injection layer (EIL) may be formed of LiF, NaCl, CsF, Li2O, BaO, or Liq.

The electron transport layer (ETL) may be formed of $Alq_a$.

The OLED display 1000 according to the present embodiment may further include a pixel defining layer 270 formed at edges of the first electrode 281. The pixel defining layer 270 may define a pixel region, in which an OLED is arranged and light is emitted, and a non-pixel region.

According to a selective embodiment, the first electrode 281 is deposited between the pixel defining layer 270, and the intermediate layer 283 is formed on the first electrode 281.

Furthermore, the second electrode 285 may be formed on the intermediate layer 283 and the pixel defining layer 270.

A protection layer 290 may be formed on the second electrode 285 and cover and protect the OLED.

According to a selective embodiment, the protection layer 290 is formed of A LiF-containing material.

According to a selective embodiment, the protection layer 290 is a buffer layer for protecting the OLED and is formed of various deposition methods, such as evaporation.

In the OLED display 1000 according to the present embodiment, the protection layer 290 is formed throughout a surface of the substrate 100 to cover the pixel defining layer 270 together with the second electrode 285.

In the OLED display 1000 according to the present embodiment, first openings OP1 are formed at at least portions of the second electrode 285 and the protection layer 290 contacting the pixel defining layer 270.

For example, at least portions of the second electrode 285 and the protection layer 290 covering the pixel defining layer 270 are removed to expose the pixel defining layer 270 arranged therebelow.

According to a selective embodiment, in the OLED display 1000 shown in FIG. 2, portions of the second electrode 285 and the protection layer 290 located on the top surface of the pixel defining layer 270 are removed, thereby forming the first opening OP1.

However, locations and numbers of the first opening OP1 are limited thereto, and the first opening OP1 may be formed at anywhere at which the second electrode 285 and the protection layer 290 contact the pixel defining layer 270.

For example, the first opening OP1 may be formed at anywhere at which the pixel defining layer 270 may be exposed by removing portions of the second electrode 285 and the protection layer 290.

A thin-film encapsulating layer 300 that seals the OLED to protect the OLED from outside moisture or oxygen may be formed on the OLED and the protection layer 290.

According to a selective embodiment, the thin-film encapsulating layer 300 has a structure in which a plurality of thin-films are stacked, where an inorganic layer 310 and an organic layer 330 may be alternately stacked.

According to a selective embodiment, as shown in FIG. 2, the thin-film encapsulating layer 300 is formed by sequentially stacking the inorganic layer 310 and the organic layer 330.

Although the OLED display 1000 according to the present embodiment includes one inorganic layer 310 and one organic layer 330, a number of the thin-films are not limited thereto, and a larger number of the thin-films are alternately stacked.

In the OLED display 1000 according to the present embodiment, the inorganic layer 310 is formed on the protection layer 290, and the organic layer 330 is formed on the inorganic layer 310.

The inorganic layer 310 may impregnably block permeation of oxygen or moisture, whereas the organic layer 330 may absorb stress of the inorganic layer 310 and provide flexibility to the organic layer 330.

The inorganic layer 310 may include a single layer or stacked layers formed of a metal oxide or a metal nitride. According to a selective embodiment, the inorganic layer 310 is formed of any one of $SiN_x$, $Al_2O_3$, $SiO_2$, and $TiO_2$.

The organic layer 330 is formed of a polymer. For example, the organic layer 330 includes a single layer or stacked layers formed of any one of polyethylene terephthalate, polyimide, polycarbonate, epoxy, polyethylene, and polyacrylate. For example, the organic layer 330 is formed of polyacrylate. For example, the organic layer 330 is formed of a polymerized monomer composition including a diacrylate monomer and a triacrylate monomer. The monomer composition may further include a monoacrylate-based monomer. Furthermore, the monomer composition may further contain a photoinitiator known in the art, e.g., TPO. However, the present disclosure is not limited thereto.

For example, the OLED may be protected by the inorganic layer 310 and, at the same time, flexibility of the OLED display 1000 may be improved by the organic layer 330.

At least a portion of the thin-film encapsulating layer 300 of the OLED display 1000 according to the present embodiment may directly contact the exposed portions of the pixel defining layer 270.

As described above, according to a selective embodiment, at least portions of the second electrode 285 and the protection layer 290 contacting the pixel defining layer 270 are removed to expose the pixel defining layer 270.

For example, the first opening OP1 is formed at at least portions of the second electrode 285 and the protection layer 290, and the pixel defining layer 270 is exposed at the first opening OP1. Therefore, the thin-film encapsulating layer 300 may be formed to directly contact the pixel defining layer 270.

According to a selective embodiment, as the thin-film encapsulating layer 300 includes the inorganic layer 310 and the organic layer 330 formed on the inorganic layer 310, the thin-film encapsulating layer 300 is formed to directly contact the pixel defining layer 270.

Therefore, since the inorganic layer 310 is formed to directly contact the pixel defining layer 270, adhesion between the thin-film encapsulating layer 300 and the display 200 is improved.

If adhesion between the thin-film encapsulating layer 300 and the display 200 is insufficient when the OLED display 1000 is flexible and bent, the thin-film encapsulating layer 300 is exfoliated due to stress.

For example, if the thin-film encapsulating layer 300 is formed to contact the protection layer 290 that is formed to have a small thickness in an evaporation operation, when the OLED display bending occurs the thin-film encapsulating layer 300 is exfoliated due to insufficient adhesion between the thin-film encapsulating layer 300 and the protection layer 290. As a result, if the thin-film encapsulating layer 300 is exfoliated in a flexible display apparatus, the OLED is not sufficiently protected, and thus reliability of the flexibly display apparatus can degrade.

Here, if at least a portion of the thin-film encapsulating layer 300 is directly adhered to the pixel defining layer 270, which is arranged below the thin-film encapsulating layer 300 and has a certain thickness, adhesion is improved, and thus thin-film encapsulating layer 300 will not be exfoliated.

Although not shown, spacers (not shown) may be further arranged on the pixel defining layer 270. According to a selective embodiment, spacers may not be formed on all of the pixel defining layers 270 and may be arbitrarily formed on some of the pixel defining layers 270.

The spacers (not shown) may be arranged to protrude upward from the pixel defining layer 270 and may be arranged to prevent deterioration of display characteristics due to external shocks.

According to a selective embodiment, the spacer may be formed of the same material in a same operation as the pixel defining layer 270. For example, the pixel defining layer 270 and the spacer may be substantially simultaneously or concurrently formed in an exposing operation by adjusting exposure by using a half-tone mask. However, the present disclosure is not limited thereto. The pixel defining layer 270 and the spacer may be sequentially or separately formed and may be independent structures formed of different materials.

According to a selective embodiment, the first opening OP1 is formed at portions of the second electrode 285 and the protection layer 290 contacting the pixel defining layer 270, where the first opening OP1 may be formed at a portion without the spacer.

At portions with the spacers, the spacers are formed on the pixel defining layer 270, and thus the thin-film encapsulating layer 300 is not exfoliated. Therefore, it is not necessary to form the first opening OP1.

Therefore, the first opening OP1 may be formed at at least portions of the second electrode 285 and the protection layer 290 contacting the pixel defining layer 270 from among portions without the spacers.

Figure 3:
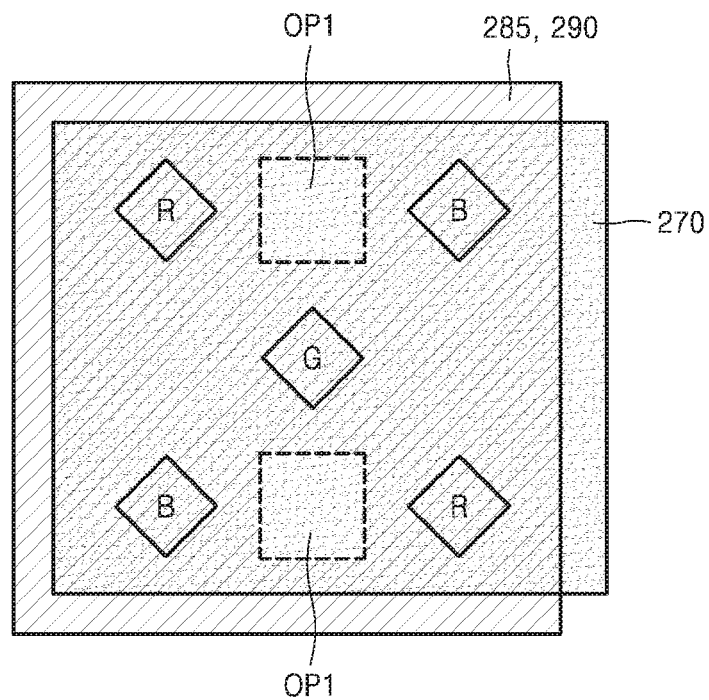
FIG. 3 is a schematic plan view diagram showing a region for forming a second electrode, a protection layer, and a pixel defining layer of the OLED display of FIG. 2.
Figure 4:
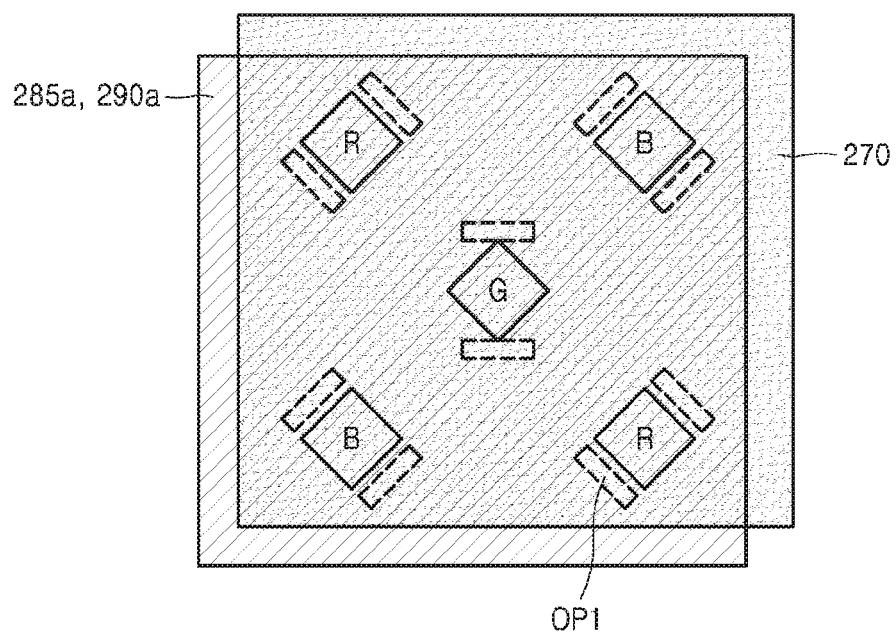
FIG. 4 shows a first opening formed in a second electrode and a protection layer according to another exemplary embodiment.
Figure 5:
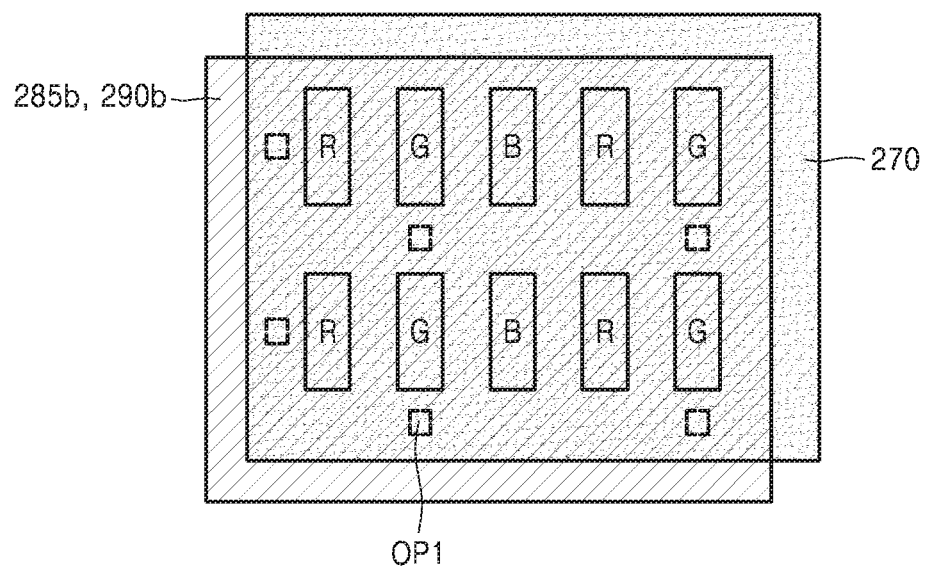
FIG. 5 shows a first opening formed in a second electrode and a protection layer according to another exemplary embodiment.

FIG. 3 is a schematic plan view diagram showing a region for forming the second electrode 285, the protection layer 290, and the pixel defining layer 270 of the OLED display 1000 of FIG. 2. FIGS. 4 and 5 are schematic plan view diagrams showing a second electrode, a protection layer, and a region for forming a pixel defining layer of OLED displays according to other exemplary embodiments.

As shown in FIG. 3, the pixel defining layer 270 may be formed, and the second electrode 285 and the protection layer 290 may be formed on the pixel defining layer 270 to cover the pixel defining layer 270.

According to a selective embodiment, the second electrode 285 and the protection layer 290 may be formed on a same region. Therefore, for convenience of explanation, the second electrode 285 and the protection layer 290 will be shown as a single component.

In the OLED display 1000 according to the present embodiment, the first opening OP1 may be formed at at least portions of the second electrode 285 and the protection layer 290. As described above, the first opening OP1 may be formed at portions of the second electrode 285 and the protection layer 290 contacting the pixel defining layer 270 and may be formed between a pixel region and another pixel region adjacent thereto.

Although FIG. 3 shows the first opening OP1 that is formed in the second electrode 285 and the protection layer 290 in the OLED display 1000 shown in FIG. 2, locations and numbers of the first opening OP1 are not limited thereto.

FIG. 4 shows a first opening OP1 formed in a second electrode 285a and a protection layer 290a according to another exemplary embodiment.

Although an OLED display according to the present embodiment has a diamond-shaped pixel region like the embodiment shown in FIG. 3, the first openings OP1 are not formed between pixel regions adjacent to each other, but are formed at regions adjacent to each pixel region.

For example, according to a selective embodiment, two first openings OP1 are formed at regions adjacent to each pixel region.

In the OLED display according to the embodiment shown in FIG. 4, a thin-film encapsulating layer (300; refer to FIG. 2) also directly contact the exposed pixel defining layer 270 at the first opening OP1, adhesion between the thin-film encapsulating layer 300 and the pixel defining layer 270 is improved, and thus the thin-film encapsulating layer 300 will not be exfoliated even if the OLED display is bent.

FIG. 5 shows a first opening OP1 formed in a second electrode 285b and a protection layer 290b according to another exemplary embodiment.

An OLED display according to the present embodiment has rectangular pixel regions unlike the embodiments shown in FIGS. 3 and 4. In this case, distances between pixel regions may be reduced compared to a case where pixel regions are formed to have a diamond-like shape.

Therefore, according to a selective embodiment, size of the first opening OP1 formed in the second electrode 285b and the protection layer 290b may be reduced.

For example, the first opening OP1 may be formed between rectangular pixel regions adjacent to each other, where size of the first opening OP1 may be smaller than those in the previous embodiments. However, locations and numbers of the first openings OP1 are not limited thereto, and the first openings OP1 may be formed at anywhere as long as the first openings OP1 are formed in the second electrode 285b and the protection layer 290b and expose the pixel defining layer 270 therebelow.

In the OLED display according to the embodiment shown in FIG. 5, a thin-film encapsulating layer (300; refer to FIG. 2) also directly contact the exposed pixel defining layer 270 at the first opening OP1, adhesion between the thin-film encapsulating layer 300 and the pixel defining layer 270 is improved, and thus the thin-film encapsulating layer 300 will not be exfoliated even if the OLED display is bent.

Figure 6:
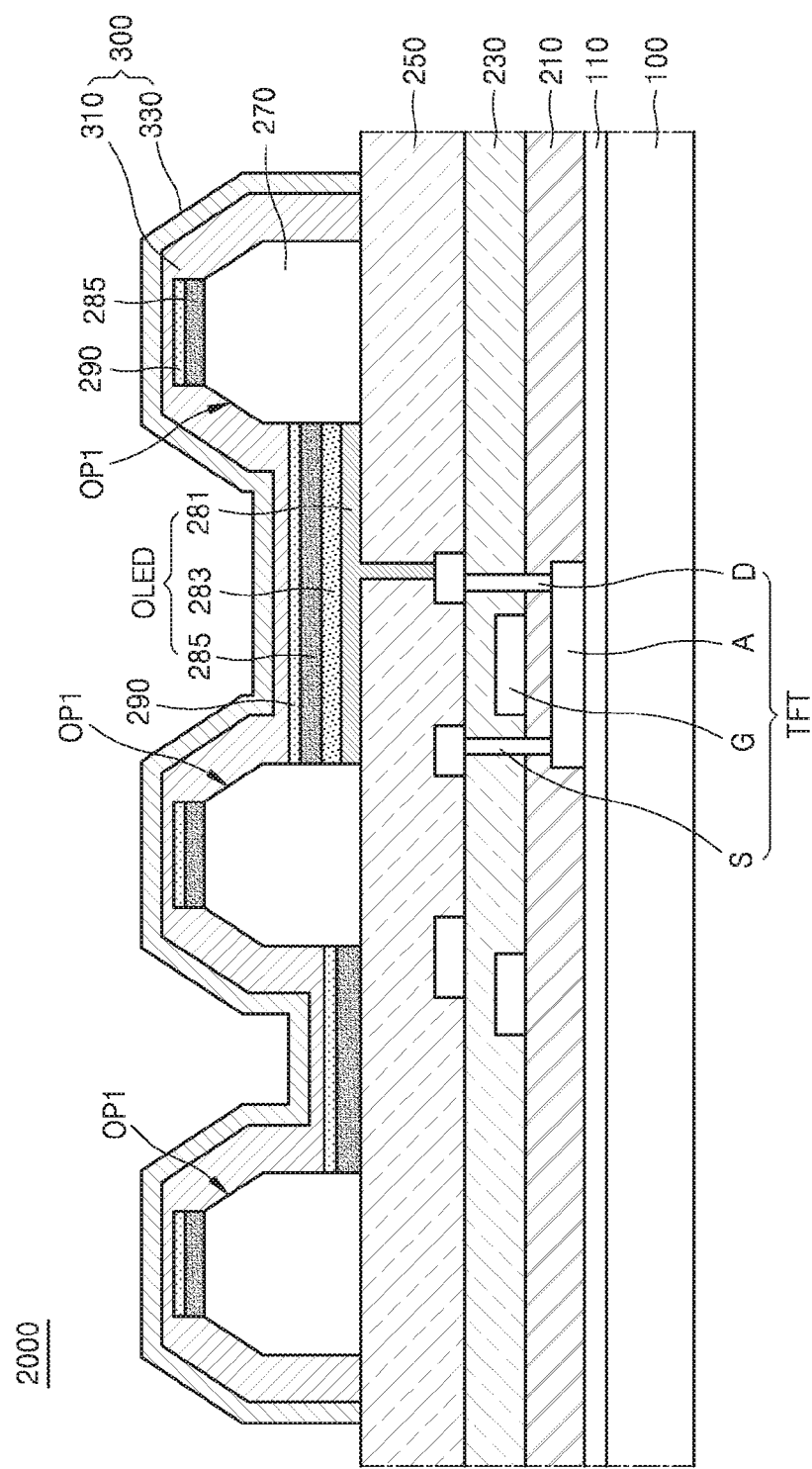
FIG. 6 is a sectional view of an OLED display according to another exemplary embodiment.

FIG. 6 is a detailed sectional view of an OLED display 2000 according to another exemplary embodiment. In FIG. 6, reference numerals identical to those shown in FIG. 2 denote same components as those shown in FIG. 2. Therefore, for simplification of explanation, detailed descriptions thereof will be omitted.

Like the OLED display 1000 according to the embodiment shown in FIG. 2, in the OLED display 2000 according to the present embodiment, a buffer layer 110, a semiconductor layer A, a gate insulation layer 210, a gate electrode G, a interlayer insulation layer 230, a source electrode S, a drain electrode D, a via layer 250, and an OLED are sequentially formed on a substrate 100.

According to a selective embodiment, a pixel defining layer 270 for defining a pixel region, in which an OLED is arranged and light is emitted, and a non-pixel region are formed on the via layer 250.

According to a selective embodiment, the OLED includes a first electrode 281, an intermediate layer 283, and a second electrode 285. The first electrode 281 is formed between pixel defining layers 270 adjacent to each other, the intermediate layer 283 may be formed on the first electrode 281, and the second electrode 285 may be pattern-formed on the intermediate layer 283 and the pixel defining layer 270.

A protection layer 290, which is a buffer layer for protecting the OLED, may be formed on the second electrode 285.

According to a selective embodiment, the protection layer 290 may be formed of a LiF-containing material. Furthermore, according to another selective embodiment, the protection layer 290 is patterned on the substrate 100 and pattern-formed to cover the pixel defining layer 270 together with the second electrode 285.

According to a selective embodiment, the first opening OP1 is formed at at least portions of the second electrode 285 and the protection layer 290 contacting the pixel defining layer 270.

In the OLED display 2000 according to the present embodiment, the first opening OP1 is formed at a side surface of the pixel defining layer 270 as shown in FIG. 6.

For example, according to a selective embodiment, portions of the second electrode 285 and the protection layer 290 contacting a side surface of the pixel defining layer 270 are patterned by removing to expose the side surface of the pixel defining layer 270.

According to a selective embodiment, the second electrode 285 and the protection layer 290 are partially patterned between the top surface of the pixel defining layer 270 and a side surface of the pixel defining layer 270 to include the first opening OP1 at the side surface of the pixel defining layer 270.

However, locations and numbers of the first openings OP1 are not limited thereto, and the first opening OP1 may be formed at any of portions of the second electrode 285 and the protection layer 290 contacting the pixel defining layer 270.

After the pixel defining layer 270 and the OLED are formed, a thin-film encapsulating layer 300 may be formed thereon to protect the OLED from outside moisture or oxygen.

The thin-film encapsulating layer 300 may be formed by alternately stacking a plurality of inorganic layers and organic layers. According to a selective embodiment, an inorganic layer 310 may be formed, and an organic layer 330 may be formed on the inorganic layer 310.

The inorganic layer 310 may be formed on the OLED to contact a portion of the pixel defining layer 270 exposed at the first opening OP1.

Since the inorganic layer 310 is formed to directly contact the pixel defining layer 270 at at least a portion, adhesion between the thin-film encapsulating layer 300 and the pixel defining layer 270 may be improved as compared to a case in which the thin-film encapsulating layer 300 is formed to contact the thin protection layer 290 deposited in an evaporation operation.

For example, if the thin-film encapsulating layer 300 is formed to contact the thin protection layer 290 formed in one of various deposition operations (e.g., an evaporation operation), adhesion between the thin-film encapsulating layer 300 and a structure below the thin-film encapsulating layer 300 is insufficient, and thus the thin-film encapsulating layer 300 may be exfoliated when the OLED display 2000 is bent.

As a result, if the thin-film encapsulating layer 300 is exfoliated in a flexible display, the OLED is not sufficiently protected, and thus reliability of the flexibly display apparatus is questioned.

On the contrary, in the OLED display 2000, the thin-film encapsulating layer 300 is formed to be adhered to at least a portion of the pixel defining layer 270 that is formed to have a certain thickness, the thin-film encapsulating layer 300 will not be exfoliated even if the OLED display 2000 is bent.

Figure 7:
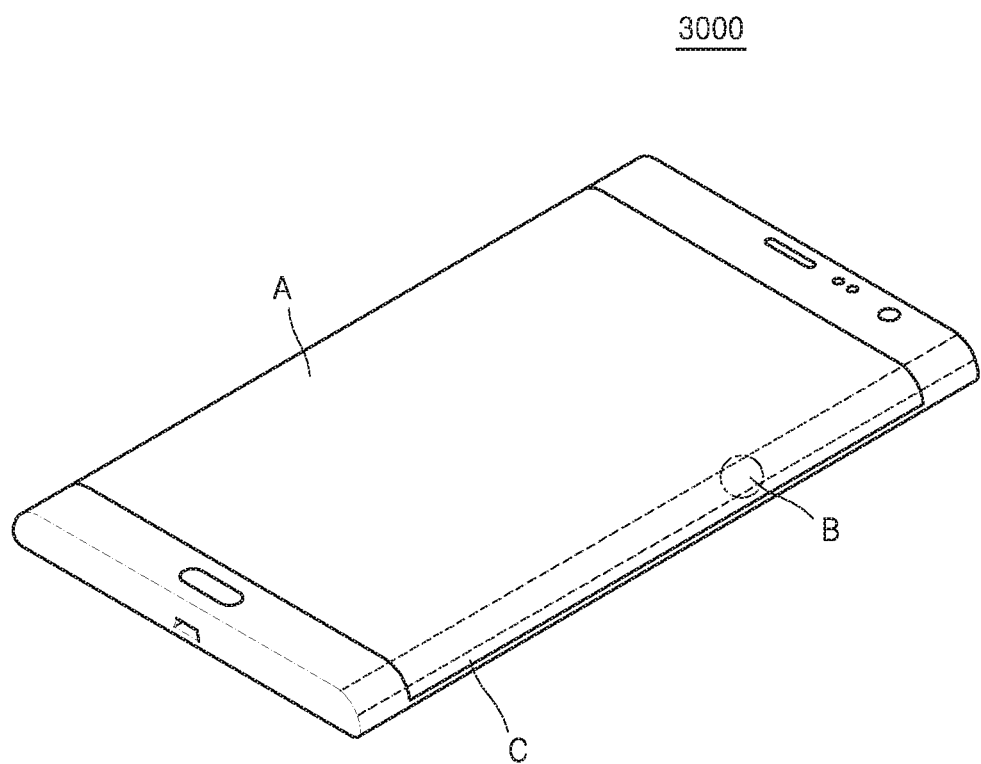
FIG. 7 is a perspective view of an OLED display according to another exemplary embodiment.

FIG. 7 is a perspective view of an OLED display 3000 according to another exemplary embodiment.

Although a mobile phone device is shown as an embodiment of the OLED display 3000 according to the present embodiment, the OLED display 3000 is not limited thereto, and any of various display apparatuses may be applicable as long as a user may recognize a screen.

According to a selective embodiment, the OLED display 3000 is a flexible display apparatus and includes a front surface portion A, which is a front surface to a user, emits light, and displays a screen image, a bending portion B, at which bending occurs, and side surface portions C, which are side surfaces of the display apparatus to the user.

According to a selective embodiment, the front surface portion A is a light-emitting region in which a screen image is displayed, whereas the bending portion B may also be an region in which a screen image is displayed.

According to a selective embodiment, the bending portion B is an region in which no screen image is displayed and a circuit is arranged.

According to a selective embodiment, the side surface portions C are light-emitting regions in which a screen image is displayed. In this case, a display region may expand, and a bending may occur in the display region.

According to a selective embodiment, the side surface portions C are regions that does not emit visible rays that may be recognized by a user, that is, bezel regions in which no screen image is displayed.

FIG. 7 shows a mobile phone device in which a screen image is displayed at all of the front surface portion A, the bending portion B, and the side surface portions C. However, according to a selective embodiment, the bending portion B and/or the side surface portions C may not be light-emitting regions as described above, and the present disclosure is not limited thereto.

Figure 8:
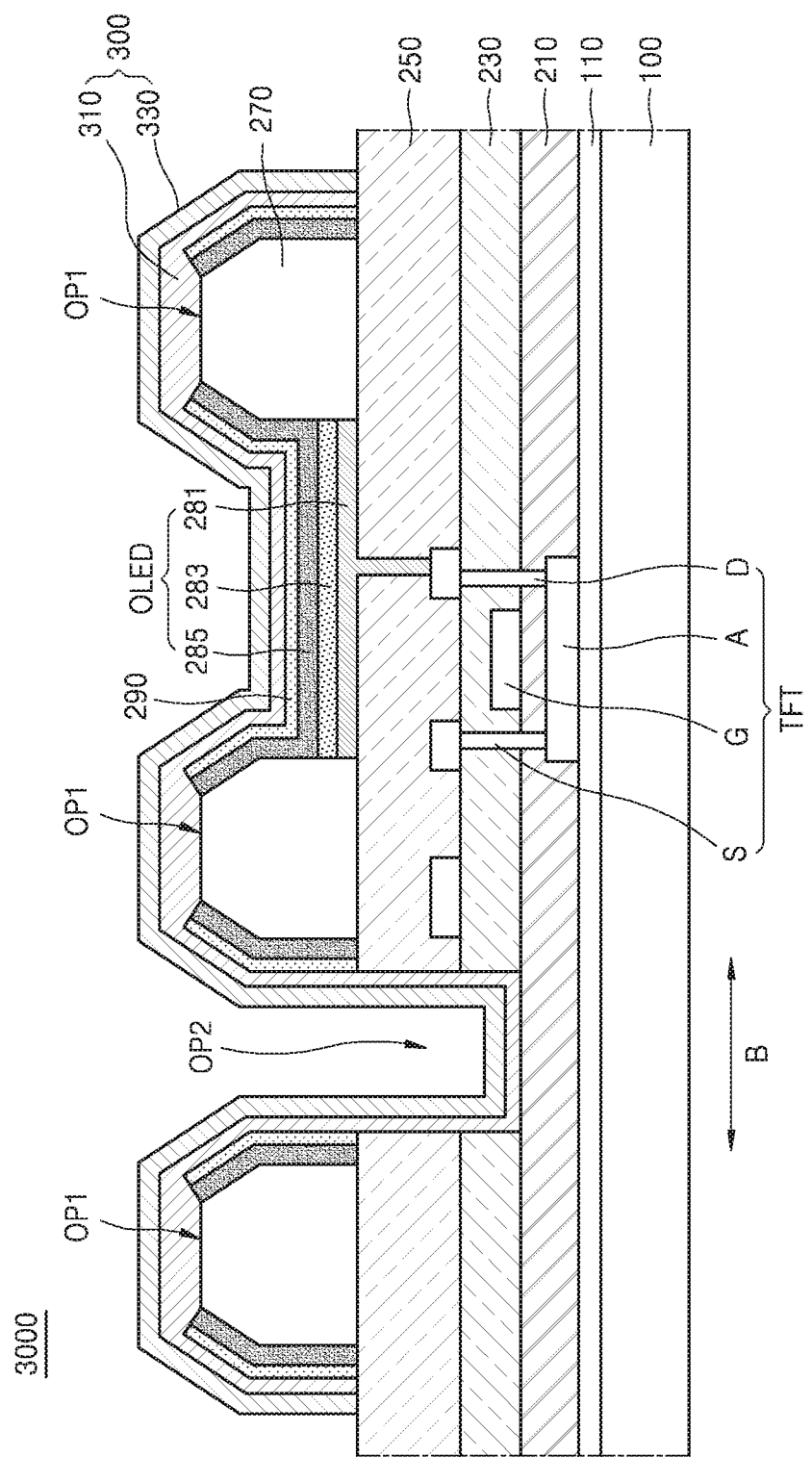
FIG. 8 is a detailed schematic sectional view of the OLED display shown in FIG. 7.

FIG. 8 is a detailed schematic sectional view of the OLED display 3000 shown in FIG. 7. In FIG. 8, reference numerals identical to those shown in FIG. 2 denote same components as those shown in FIG. 2. Therefore, for simplification of explanation, detailed descriptions thereof will be omitted.

Like the OLED display 1000 according to the embodiment shown in FIG. 2, in the OLED display 3000 according to the present embodiment, a buffer layer 110, a semiconductor layer A, a gate insulation layer 210, a gate electrode G, a interlayer insulation layer 230, a source electrode S, a drain electrode D, a via layer 250, and an OLED may be formed on a substrate 100 in the order stated.

In the OLED display 3000, a second opening OP2 is formed at the interlayer insulation layer 230 and the via layer 250 corresponding to the bending portion B at which a bending occurs.

For example, the interlayer insulation layer 230 and the via layer 250 are patterned to be removed at the bending portion B.

According to a selective embodiment, a pixel defining layer 270 for defining a pixel region including the OLED and a non-pixel region are formed on the via layer 250.

According to a selective embodiment, the OLED includes a first electrode 281, an intermediate layer 283, and a second electrode 285, where the first electrode 281 may be formed between the pixel defining layers 270 adjacent to each other, the intermediate layer 283 may be formed on the first electrode 281, and the second electrode 285 may be formed on the intermediate layer 283 and the pixel defining layer 270.

A protection layer 290, which is a buffer layer for protecting the OLED, may be formed on the second electrode 285.

According to a selective embodiment, the protection layer 290 may be formed of a LiF-containing material. Furthermore, according to another selective embodiment, the protection layer 290 may be patterned on the substrate 100 and pattern-formed to cover the pixel defining layer 270 together with the second electrode 285.

According to a selective embodiment, the first openings OP1 are formed at at least portions of the second electrode 285 and the protection layer 290 contacting the pixel defining layer 270.

For example, at least portions of the second electrode 285 and the protection layer 290 covering the pixel defining layer 270 may be removed to expose the pixel defining layer 270 arranged therebelow.

According to a selective embodiment, in the OLED display 3000 shown in FIG. 7, portions of the second electrode 285 and the protection layer 290 located on the top surface of the pixel defining layer 270 may be removed, thereby forming the first opening OP1.

However, locations and numbers of the first opening OP1 are limited thereto, and the first opening OP1 may be formed anywhere where the second electrode 285 and the protection layer 290 contact the pixel defining layer 270. For example, the first opening OP1 may be formed at anywhere at which the pixel defining layer 270 may be exposed by removing portions of the second electrode 285 and the protection layer 290.

A thin-film encapsulating layer 300 that seals the OLED to protect the OLED from outside moisture or oxygen may be formed on the OLED and the protection layer 290. According to a selective embodiment, the thin-film encapsulating layer 300 includes an inorganic layer 310 formed at the bottom and an organic layer 330 formed on the inorganic layer 310.

According to a selective embodiment, the thin-film encapsulating layer 300 is formed to directly contact the pixel defining layer 270.

Therefore, since the inorganic layer 310 is formed to directly contact the pixel defining layer 270, adhesion between the thin-film encapsulating layer 300 and the display 200 is improved.

If adhesion between the thin-film encapsulating layer 300 and the display 200 is insufficient when the OLED display 1000 is flexible and bent, the thin-film encapsulating layer 300 is exfoliated due to stress.

For example, if the thin-film encapsulating layer 300 is formed to contact the protection layer 290 that is formed to have a small thickness in an evaporation operation, when the OLED display bending occurs the thin-film encapsulating layer 300 is exfoliated due to insufficient adhesion between the thin-film encapsulating layer 300 and the protection layer 290. As a result, if the thin-film encapsulating layer 300 is exfoliated in a flexible display apparatus, the OLED is not sufficiently protected, and thus reliability of the flexibly display apparatus can degrade.

Here, if at least a portion of the thin-film encapsulating layer 300 is directly adhered to the pixel defining layer 270, which is arranged below the thin-film encapsulating layer 300 and has a certain thickness, adhesion between the thin-film encapsulating layer 300 and the pixel defining layer 270 is improved, and thus thin-film encapsulating layer 300 will not be exfoliated.

The thin-film encapsulating layer 300 of the OLED display 3000 according to the present embodiment is directly adhered to the gate insulation layer 210 at the second opening OP2.

According to a selective embodiment, the second opening OP2 is formed at the bending portion B, and the interlayer insulation layer 230 and the via layer 250 are patterned to be removed at the second opening OP2. Therefore, at the second opening OP2, the thin-film encapsulating layer 300 formed thereon may be formed to directly contact the top surface of the gate insulation layer 210.

According to a selective embodiment, the inorganic layer 310 included in the thin-film encapsulating layer 300 is formed to contact the top surface of the gate insulation layer 210 at the second opening OP2.

Furthermore, according to a selective embodiment, the thin-film encapsulating layer 300 is formed to directly contact side surfaces of the interlayer insulation layer 230 and the via layer 250 at the second opening OP2.

According to a selective embodiment, the inorganic layer 310 included in the thin-film encapsulating layer 300 is formed to contact side surfaces of the interlayer insulation layer 230 and the via layer 250 at the second opening OP2.

Thickness of the OLED display 3000 may be reduced at the bending portion B. For example, since the gate insulation layer 210 is arranged on the substrate 100 and the thin-film encapsulating layer 300 is formed directly on the gate insulation layer 210, thickness of the bending portion B of the OLED display 3000 may become smaller than thickness of the remaining portions of the OLED display 3000.

Therefore, as thickness of the bending portion B at which a bending occurs is reduced, stress may be reduced, and thus flexibility of the OLED display 3000 may be improved.

Furthermore, at the second opening OP2, the thin-film encapsulating layer 300 is not formed to have a small thickness in an evaporation operation, but is formed to directly contact the pixel defining layer 270 that is formed to have a certain thickness. Therefore, adhesion of the thin-film encapsulating layer 300 to a structure therebelow may be improved at the bending portion B.

At a region at which a bending occurs, if adhesion between the thin-film encapsulating layer 300 and a structure therebelow is insufficient, the thin-film encapsulating layer 300 may be easily exfoliated. Therefore, in the OLED display 3000, the thin-film encapsulating layer 300 is directly adhered to the gate insulation layer 210 therebelow at the bending portion B, at which a bending occurs, and thus adhesion between the thin-film encapsulating layer 300 and a structure therebelow may be improved.

However, although FIG. 8 shows that, in the OLED display 3000, the second opening OP2 is formed at the interlayer insulation layer 230 and the via layer 250 and the thin-film encapsulating layer 300 is formed directly on the gate insulation layer 210, the present disclosure is not limited thereto.

For example, according to a selective embodiment, the second opening OP2 may be formed only at the via layer 250. In this case, only the via layer 250 is patterned to be removed at the second opening OP2, and the thin-film encapsulating layer 300 is formed to be directly adhered to the interlayer insulation layer 230.

Figure 9:
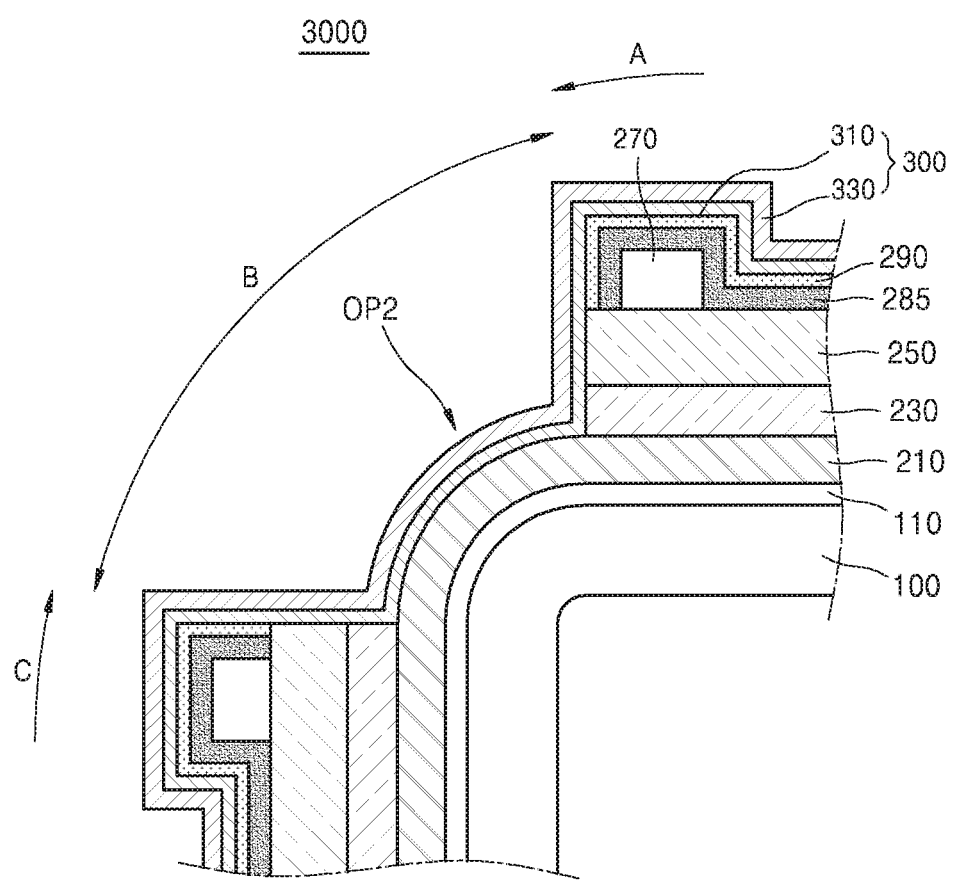
FIG. 9 is a detailed schematic sectional view diagram showing the bent OLED display around a bending portion.

FIG. 9 is a schematic sectional view diagram showing the bent OLED display 3000 around the bending portion B in closer details. In FIG. 9, reference numerals identical to those shown in FIG. 8 denote same components as those shown in FIG. 8. Therefore, for simplification of explanation, detailed descriptions thereof will be omitted.

As shown in FIG. 9, the OLED display 3000 according to the present embodiment may be bent at the bending portion B.

According to a selective embodiment, components formed on the substrate 100 may include the buffer layer 110, the gate insulation layer 210, and the thin-film encapsulating layer 300 only, where thickness of the bending portion B may be smaller than those of the portions A and C other than the bending portion B.

Therefore, thickness of a bending portion is reduced, stresses applied to stacked layers when the OLED display 3000 is bent are reduced, and thus flexibility of the OLED display 3000 may be improved. Furthermore, as the second opening OP2 is formed at the interlayer insulation layer 230 and the via layer 250 at the bending portion B, the thin-film encapsulating layer 300 is formed to be directly adhered to the gate insulation layer 210. As a result, even if the OLED display 3000 is bent, the thin-film encapsulating layer 300 may not be exfoliated due to improved adhesion of the thin-film encapsulating layer 300 to a structure therebelow.

Hereinafter, a method of manufacturing the OLED display 1000 according to an exemplary embodiment will be described in detail.

A flexible substrate 100 may be provided, a buffer layer 110 may be provided on the substrate 100, and a thin-film transistor TFT may be formed on the buffer layer 110.

A semiconductor layer A is formed of a semiconductor including amorphous silicon or a crystalline silicon. The semiconductor layer A may be deposited using one of various deposition methods on the buffer layer 110. Here, the crystalline silicon may be formed by crystallizing amorphous silicon. According to a selective embodiment, amorphous silicon may be crystallied by using one of various methods including a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method. According to a selective embodiment, the semiconductor layer A may be patterned in a photolithography operation.

A gate insulation layer 210 insulates the semiconductor layer A from a gate electrode G to be formed thereto and is formed thoroughly on the buffer layer 110 to cover the semiconductor layer A. The gate insulation layer 210 may be formed of one of various deposition methods including sputtering, chemical vapor deposition (CVD), or plasma-enhanced chemical vapor deposition (PECVD).

Next, the gate electrode G may be formed on the gate insulation layer 210, such that the gate electrode G to at least partially overlap the semiconductor layer A.

Next, an interlayer insulation layer 230 is formed thoroughly on the substrate to cover the gate electrode G. According to a selective embodiment, the interlayer insulation layer 230 may be formed of one of various deposition methods including sputtering, chemical vapor deposition (CVD), or plasma-enhanced chemical vapor deposition (PECVD).

Next, a source electrode S and a drain electrode D may be formed on the interlayer insulation layer 230, and a via layer 250 is formed thoroughly on the substrate to cover the source electrode S and the drain electrode D.

A pixel defining layer 270 that defines a pixel region and a non-pixel region may be formed on the via layer 250, and spacers (not shown) may be formed on portions of the pixel defining layer 270.

A first electrode 281 may be formed between the pixel defining layers 270, an intermediate layer 283 may be formed on the first electrode 281, and a second electrode 285 may be formed on the intermediate layer 283 and the pixel defining layer 270.

Here, a first opening OP1 at which the second electrode 285 is removed may be formed at a portion of a region in which the second electrode 285 and the pixel defining layer 270 contact each other.

For example, the second electrode 285 may be pattern-formed thoroughly on the substrate, such that a portion of the second electrode 285 is removed at the first opening OP1 to expose the pixel defining layer 270.

A protection layer 290 for protecting an OLED may be formed on the second electrode 285. According to a selective embodiment, the protection layer 290 may be formed of LiF by depositing a LiF thin-film in an evaporation operation.

Here, the protection layer 290 may be formed to cover the pixel defining layer 270 together with the second electrode 285.

According to a selective embodiment, the first opening OP1 at which the protection layer 290 is removed may be formed at a portion of a region in which the protection layer 290 and the pixel defining layer 270 contact each other.

For example, the protection layer 290 may be pattern-formed on the substrate to expose the pixel defining layer 270 by removing a portion of the protection layer 290 at a same location as that of the first opening OP1 at which a portion of the second electrode 285 is removed.

After the OLED and the protection layer 290 are formed, a thin-film encapsulating layer 300 for sealing the OLED may be formed to protect the OLED from outside moisture or oxygen.

Here, an inorganic layer 310 may be formed, and then an organic layer 330 may be formed on the inorganic layer 310, where the inorganic layer 310 may be formed to directly contact the pixel defining layer 270 at the first opening OP1.

Therefore, the OLED display 1000 according to the present embodiment is formed, such that the thin-film encapsulating layer 300 directly contacts the pixel defining layer 270 at at least a region. Therefore, adhesion between the thin-film encapsulating layer 300 and the pixel defining layer 270 may be improved.

Hereinafter, a method of manufacturing the OLED display 3000 according to an exemplary embodiment will be described in detail with reference to FIG. 8. For convenience of explanation, descriptions identical to those given above in relation to the method of manufacturing the OLED display 1000 according to the embodiment shown in FIG. 2 will be omitted.

A substrate 100 formed of a flexible material may be provided, a buffer layer 110 may be formed on the substrate 100, and a thin-film transistor TFT may be formed on the buffer layer 110.

A semiconductor layer A may be formed on the buffer layer 110, and a gate insulation layer 210 may be formed to cover the semiconductor layer A. A gate electrode G may be formed on the gate insulation layer 210 to at least partially overlap the semiconductor layer A.

Next, an interlayer insulation layer 230 may be pattern-formed to cover the gate electrode G. According to a selective embodiment, the interlayer insulation layer 230 may be formed of one of various deposition methods including sputtering, chemical vapor deposition (CVD), or plasma-enhanced chemical vapor deposition (PECVD).

Furthermore, according to a selective embodiment, the interlayer insulation layer 230 may be pattern-formed, such that a portion of the interlayer insulation layer 230 is removed at the bending portion B. Therefore, a second opening OP2 may be formed at the bending portion B.

Next, a source electrode S and a drain electrode D may be formed on the interlayer insulation layer 230, and a via layer 250 may be formed to cover the source electrode S and the drain electrode D.

According to a selective embodiment, the via layer 250 may be deposited, such that a portion of the via layer 250 is removed at the bending portion B. Therefore, the second opening OP2 may be formed at the bending portion B.

For example, portions of the interlayer insulation layer 230 and the via layer 250 are removed at the bending portion B, and thus the second opening OP2 may be formed at portions of the interlayer insulation layer 230 and the via layer 250 at the bending portion B.

An OLED and a pixel defining layer 270 may be formed on the via layer 250. A protection layer 290 may be formed on the OLED and the pixel defining layer 270, where the protection layer 290 may be formed in one of various deposition operations, such as an evaporation operation. According to a selective embodiment, the protection layer 290 may be formed of a LiF-containing material.

After the OLED and the protection layer 290 are formed, a thin-film encapsulating layer 300 that seals the OLED to protect the OLED from outside moisture or oxygen may be formed.

Here, an inorganic layer 310 may be formed, and then an organic layer 330 may be formed on the inorganic layer 310, where the inorganic layer 310 may be formed to directly contact the gate insulation layer 210 at the second opening OP2.

Therefore, thickness of the bending portion B may be reduced and adhesiveness of the thin-film encapsulating layer 300 may be improved. As a result, concentration of stress at the bending portion B or an exfoliation of the thin-film encapsulating layer 300 in a flexible OLED display may be prevented.

As described above, according to the one or more of the above exemplary embodiments, an exfoliation of a thin-film encapsulating layer of an OLED display due to deterioration of adhesiveness may be prevented.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the drawings, it will be understood by those of ordinary skill in the art that various changes in form and details may be made therein without departing from the spirit and scope as defined by the following claims.

What is claimed is:

1. An organic light-emitting diode (OLED) display comprising:
   a substrate;
   an OLED formed over the substrate and comprising a first electrode, a second electrode formed over the first electrode and an intermediate layer interposed between the first and second electrodes;
   a pixel defining layer formed over the substrate and adjacent to the OLED;
   a protection layer formed over the second electrode and configured to protect the OLED; and
   a thin-film encapsulating layer formed over the protection layer and sealing the OLED so as to protect the OLED from the environment,
   wherein the thin-film encapsulating layer comprises an inorganic layer and an organic layer formed over the inorganic layer, and
   wherein at least a part of the inorganic layer contacts the pixel defining layer.

2. The OLED display of claim 1, wherein the first electrode is formed between adjacent pixel defining layers, wherein the intermediate layer is formed over the first electrode, and wherein the second electrode and the protection layer are formed over the intermediate layer and the pixel defining layer.

3. The OLED display of claim 1, wherein the protection layer is formed of LiF.

4. The OLED display of claim 2, wherein the second electrode and the protection layer have a first opening formed over the pixel defining layer, the first opening overlaps at least a part of the thin-film encapsulating layer contacts the pixel defining layer.

5. The OLED display of claim 4,
   wherein the inorganic layer contacts the pixel defining layer at the first opening.

6. The OLED display of claim 1, wherein the thin-film encapsulating layer further comprises a plurality of inorganic layers and a plurality of organic layers that are alternately stacked.

7. The OLED display of claim 1, further comprising:
   a thin-film transistor (TFT) including an active layer, a gate electrode, a source electrode, and a drain electrode is formed over the substrate;
   a gate insulation layer formed between the active layer and the gate electrode;
   an interlayer insulation layer formed between the gate electrode and the source and drain electrodes; and
   a via layer formed over the source and drain electrodes.

8. The OLED display of claim 7, wherein the substrate comprises a bending portion configured to bend, and wherein the interlayer insulation layer and the via layer have a second opening formed over the bending portion.

9. The OLED display of claim 8, wherein the thin-film encapsulating layer contacts the gate insulation layer at the second opening.

10. The OLED display of claim 8, wherein the thin-film encapsulating layer contacts side surfaces of the interlayer insulation layer and the via layer at the second opening.

11. The OLED display of claim 8, wherein the inorganic layer contacts the gate insulation layer at the second opening.

12. A method of manufacturing an organic light-emitting diode (OLED) display, the method comprising:
   providing a substrate;
   forming a thin-film transistor (TFT) and a via layer over the substrate;
   forming a pixel defining layer over the via layer;
   forming an OLED over the via layer;
   forming a protection layer over the OLED so as to cover the pixel defining layer; and
   forming a thin-film encapsulating layer that seals the OLED and the protection layer to protect the OLED from the environment,
   wherein the forming of the OLED comprises:
      forming a first electrode between adjacent pixel defining layers;
      forming an intermediate layer over the first electrode; and
      forming a second electrode over the intermediate layer and the first electrode,
   wherein the second electrode and the protection layer are pattern-formed such that at least portions thereof contacting the pixel defining layer are removed and a first opening is formed therein,
   wherein the forming of the thin-film encapsulating layer comprises:
      forming an inorganic layer over the protection layer; and
      forming an organic layer over the inorganic layer, and
   wherein the inorganic layer contacts the pixel defining layer at the first opening.

13. The method of claim 12, wherein the protection layer is formed of LiF.

14. The method of claim 12, wherein the substrate comprises a bending portion configured to bend, and
wherein the method further comprises:
after the providing of the substrate, forming a gate insulation layer over the substrate;
forming an interlayer insulation layer over the gate insulation layer; and
forming a via layer over the interlayer insulation layer.

15. The method of claim 14, wherein the interlayer insulation layer and the via layer are pattern-formed to be partially removed at the bending portion such that a second opening is formed in the second electrode and the protection layer.

16. The method of claim 15, wherein the thin-film encapsulating layer contacts the gate insulation layer at the second opening.

17. The method of claim 15, wherein the thin-film encapsulating layer contacts side surfaces of the interlayer insulation layer and the via layer at the second opening.

18. An organic light-emitting diode (OLED) display comprising:
a substrate;
a plurality of OLEDs formed over the substrate;
a pixel defining layer interposed between the OLEDs;
a thin-film encapsulating layer formed over the pixel defining layer and sealing the OLED so as to protect the OLEDs from the environment,
wherein the thin-film encapsulating layer comprises an inorganic layer and an organic layer formed over the inorganic layer, and
wherein the inorganic layer contacts the pixel defining layer through a plurality of openings.

* * * * *